United States Patent
Moss et al.

(10) Patent No.: US 9,872,415 B2
(45) Date of Patent: Jan. 16, 2018

(54) DRY POWER SUPPLY ASSEMBLY FOR IMMERSION-COOLED INFORMATION HANDLING SYSTEMS

(71) Applicant: Dell Products, L.P., Round Rock, TX (US)

(72) Inventors: David L. Moss, Austin, TX (US); Edmond I. Bailey, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 32 days.

(21) Appl. No.: 14/955,069

(22) Filed: Dec. 1, 2015

(65) Prior Publication Data

US 2017/0156233 A1    Jun. 1, 2017

(51) Int. Cl.
*H05K 7/20* (2006.01)
*H05K 7/14* (2006.01)

(52) U.S. Cl.
CPC ....... *H05K 7/1492* (2013.01); *H05K 7/20136* (2013.01); *H05K 7/20236* (2013.01); *H05K 7/20727* (2013.01); *H05K 7/20763* (2013.01); *H05K 7/20818* (2013.01)

(58) Field of Classification Search
CPC .... G01R 31/28; G05D 23/01; H05K 7/20381; H05K 7/1492; H05K 7/20763; H05K 7/20718; H05K 7/2023
See application file for complete search history.

(56) References Cited

U.S. PATENT DOCUMENTS

| | | | | |
|---|---|---|---|---|
| 4,302,793 A * | 11/1981 | Rohner | .............. | H05K 7/20272 174/15.1 |
| 5,297,621 A * | 3/1994 | Taraci | ................ | G01R 31/2891 165/104.13 |
| 6,019,167 A * | 2/2000 | Bishop | ...................... | F28F 1/10 165/104.19 |
| 7,905,106 B2 * | 3/2011 | Attlesey | .................... | G06F 1/20 165/104.33 |
| 7,934,386 B2 * | 5/2011 | Rummel | ............. | F28D 15/0275 62/118 |
| 8,817,465 B2 * | 8/2014 | Campbell | .......... | H05K 7/20709 361/600 |
| 9,049,800 B2 * | 6/2015 | Shelnutt | ................. | H05K 7/203 |
| 2007/0213000 A1 * | 9/2007 | Day | ................... | H05K 7/20745 454/184 |
| 2007/0227710 A1 * | 10/2007 | Belady | ................. | H05K 7/2079 165/122 |

(Continued)

*Primary Examiner* — Robert J Hoffberg
*Assistant Examiner* — Matt Dhillon
(74) *Attorney, Agent, or Firm* — Fogarty LLP

(57) ABSTRACT

Systems and methods for a dry power supply for immersion-cooled Information Handling Systems (IHSs) are described. In some embodiments, an IHS may include: a chassis configured to be at least partially disposed under a surface of a dielectric liquid coolant, where the chassis includes one or more components configured to be cooled by the dielectric liquid coolant during operation of the IHS; and a power supply coupled to the chassis and configured to provide power to the one or more components via an adaptor configured to maintain the power supply above the surface of the dielectric liquid coolant during operation of the IHS, where the power supply comprises a fan configured to blow air.

10 Claims, 5 Drawing Sheets

(56) References Cited

U.S. PATENT DOCUMENTS

| | | | | |
|---|---|---|---|---|
| 2011/0132579 A1* | 6/2011 | Best | ................... | H05K 7/20763 |
| | | | | 165/104.31 |
| 2014/0109610 A1* | 4/2014 | Wulf | ......................... | F24F 1/00 |
| | | | | 62/314 |
| 2014/0178222 A1* | 6/2014 | Hou | ................... | F04D 25/0613 |
| | | | | 417/423.15 |
| 2014/0307384 A1* | 10/2014 | Best | ................... | H05K 7/20781 |
| | | | | 361/679.53 |
| 2015/0013940 A1 | 1/2015 | Best et al. | | |
| 2015/0013960 A1 | 1/2015 | Best et al. | | |

* cited by examiner

DRY POWER SUPPLY ASSEMBLY FOR IMMERSION-COOLED INFORMATION HANDLING SYSTEMS

FIELD

This disclosure relates generally to Information Handling Systems (IHSs), and more specifically, to a dry power supply assembly for immersion-cooled IHSs.

BACKGROUND

As the value and use of information continues to increase, individuals and businesses seek additional ways to process and store information. An option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Typically, IHSs are designed for air cooling. Conventional IHSs (e.g., servers, etc.) usually comprise one or more printed circuit boards having a plurality of electrical components mounted thereon—these printed circuit boards are housed in an enclosure having vents that allow external air to flow into the enclosure, and then out of the enclosure after being routed internally through the enclosure for cooling the IHS. In many instances, a fan is also located within the enclosure to facilitate this airflow.

In general, a lower air temperature allows each IHS component to dissipate more power and therefore operate at a level of hardware performance. Consequently, IHS facilities (e.g., data centers, etc.) have used sophisticated air conditioning systems to cool the air within it for achieving a desired performance level. As energy costs and power dissipation continue to increase, however, the total cost of cooling these facilities has also increased.

As an alternative to air cooling, immersion cooling of IHSs (e.g., in a dielectric liquid coolant, as opposed to air) has been attempted in certain applications, but has not yet enjoyed widespread commercial success. Moreover, researchers have tried to reduce the power of individual components such as the power supply and CPU, but also without success.

Particularly with respect to power supplies, the inventors hereof have recognized that submerging an off-the-shelf power supply in any dielectric liquid coolant causes the power supply's internal fan to fail over time (often within a few minutes). Conventional power supplies' fans are designed to work with ambient air, and re-designing those fans for each different type of liquid coolant is not practical. Furthermore, simply removing the fan or turning it off altogether (to rely only on the liquid cooling to keep the power supply's temperature in check) causes the power supply to operate outside of its certification parameters, if it can operate at all.

To address these, and other problems, the inventors hereof have developed a dry power supply assembly for immersion-cooled IHSs described herein.

SUMMARY

Embodiments of a dry power supply assembly for immersion-cooled Information Handling Systems (IHSs) are described herein. In an illustrative, non-limiting embodiment, an IHS may include: a chassis configured to be at least partially disposed under a surface of a dielectric liquid coolant, where the chassis includes one or more components configured to be cooled by the dielectric liquid coolant during operation of the IHS; and a power supply coupled to the chassis and configured to provide power to the one or more components via an adaptor configured to maintain the power supply above the surface of the dielectric liquid coolant during operation of the IHS, where the power supply comprises a fan configured to blow air.

In several embodiments, the IHS may be a server. The chassis may be unsealed against the dielectric liquid coolant. The dielectric liquid coolant may include oil. The dielectric liquid coolant may be held inside a tank, the tank may include a top and a rack, and the chassis may be mountable on the rack such that the IHS is removable from the tank through the top while another IHS remains in operation at least partially disposed under the surface of the dielectric liquid coolant. The one or more components may include a processor.

For example, the power supply may be an off-the-shelf power supply. The adaptor may include a first electrical connector configured to be coupled to the IHS and a second electrical connector configured to be coupled to the power supply. The first and second electrical connectors may be coupled to each other via a printed circuit board (PCB) extender, and the second electrical connector may be disposed on an opposite side of the PCB extender from the first electrical connector. The adaptor may include a bay coupled to the PCB extender and configured to receive the power supply, the bay configured to allow a power supply connector to be coupled to the second electrical connector.

The bay may be configured to hold the power supply above the surface of the dielectric liquid coolant while a portion of the PCB extender remains under the surface of the dielectric liquid coolant. The bay may include a handle portion configured to allow a user to slide the power supply in and out of the bay coupling and decoupling the power supply to and from the IHS, respectively.

In another illustrative, non-limiting embodiment, a power supply adaptor may include a PCB extender having a first electrical connector configured to be coupled to the IHS and a second electrical connector configured to be coupled to a power supply; and a bay coupled to the PCB extender and configured to receive the power supply, the bay configured to allow the power supply to be coupled to the second electrical connector. The second electrical connector may be disposed on an opposite side of the PCB extender from the first electrical connector.

The bay may be configured to hold the power supply above a surface of a dielectric liquid coolant while a portion of the PCB extender remains under the surface of the dielectric liquid coolant. The power supply may provide power to an IHS having a chassis that is being cooled by the dielectric liquid coolant within a tank.

In yet another illustrative, non-limiting embodiment, a power supply assembly may include: a power supply configured to provide power to an IHS having a chassis cooled by a dielectric liquid coolant within a tank; and a PCB extender having a first electrical connector configured to the coupled to the IHS and a second electrical connector configured to be coupled to the power supply while keeping the power supply above a surface of the dielectric liquid coolant when a portion of the PCB extender remains under the surface of the dielectric liquid coolant.

The second electrical connector may be disposed on an opposite side of the PCB extender from the first electrical connector. The power supply may further comprise a bay coupled to the PCB extender and configured to receive the power supply, the bay configured to allow the power supply to be coupled to the second electrical connector. The bay may include a handle portion configured to allow a user to slide the power supply in and out of the bay coupling and decoupling the power supply to and from the IHS, respectively.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. A more detailed example of an IHS is described with respect to FIG. 3.

Figure 1:
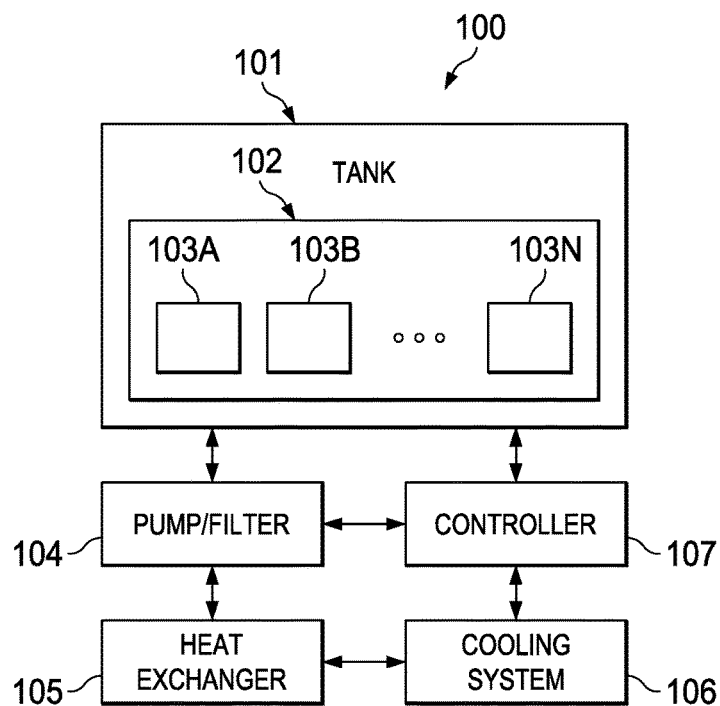
FIG. 1 is a diagram of an example of an immersion cooling system, according to some embodiments.

As noted above, the inventors hereof have developed a dry power supply adaptor for immersion-cooled IHSs. To illustrate an example of an environment where the systems and methods described herein may be used, FIG. 1 is a block diagram of immersion cooling system 100. In various embodiments, system 100 may be capable of cooling one or more IHSs 103 A-N containing heat-generating components by reducing the temperature difference between heat generating or dissipating components, and a "liquid coolant" used to cool those components.

As used herein, the term "liquid coolant" includes any non-conductive liquid such that electrical components of an IHS (e.g., a motherboard, a memory, and other electrical and/or electronic components designed for use in air) continue to operate reliably while submerged without significant modification. In some embodiments, a suitable liquid coolant is a dielectric liquid coolant, including for example vegetable oil, mineral oil (e.g., transformer oil), etc.

System 100 includes tub or tank 101 containing a dielectric liquid coolant into which a plurality of IHSs 103A-N may be immersed or submerged. Rack 102 is positioned within tank 101 and is configured to receive and mount the plurality of IHSs 103A-N into tank 101. As shown in more detail in FIG. 2 below, tank 101 may have an opening for access to each of IHSs 103A-N mounted in rack 102. At least a portion of each IHS 103A-N is submerged within the dielectric liquid coolant for sufficiently cooling each respective IHS when tank 101 is sufficiently full of the liquid coolant. In various embodiments, each of IHSs 103A-N is completely submerged within the dielectric liquid coolant during their normal operation.

The liquid coolant heated by IHSs 103A-N in rack 102 is coupled through piping or lines to a pump/filter assembly 104, which in turn filters and pumps the heated liquid coolant through suitable piping or lines to a remotely or distally located heat exchanger 105 associated with a heat-rejection or cooling system 106. Heat exchanger 105 rejects the heat from the incoming heated liquid coolant and couples the cooled liquid coolant through a return fluid line or piping back into tank 101.

Thus, at least a portion of the liquid coolant completes a closed circuit through IHSs 103A-N in tank 101, pump/filter assembly 130, heat exchanger 105, and back into tank 101. The heat rejected from the heated liquid coolant through heat exchanger 105 is used by cooling system 106 to dissipate, recover, or beneficially use the rejected heat.

System 100 also includes controller 107 configured to receive and monitor signals of various operational parameters from various components of system 100 (and the environment), and to generate control signals to control various components of system 100. These signals may be used to maintain the heated liquid coolant exiting IHSs 103A-N in tank 101 at a specific temperature and in order to sufficiently cool each of IHSs 103A-N while reducing the amount of energy needed to cool them.

Particularly, controller 107 may monitor the temperature of the liquid coolant in at least one location within the fluid circuit, for example, where the heated liquid circuit exits IHSs 103A-N. Controller 107 may also monitor the temperature of the heat-generating electronic components in IHSs 103A-N by electrically connecting controller 107 to the diagnostic output signals generated by conventional rack-mountable IHSs. In some cases, controller 107 may also monitor the flow of the dielectric liquid coolant.

Based at least in part upon this information, controller 107 may output signals to pump/filter assembly 104 and cooling system 106 to adjust the flow of the liquid coolant through the fluid circuit and the amount of the heat being rejected for sufficiently cooling each respective IHS while maintaining the heated liquid coolant exiting IHSs 103A-N at an elevated temperature to reduce the amount of energy consumed to sufficiently cool each IHS.

Figure 2:
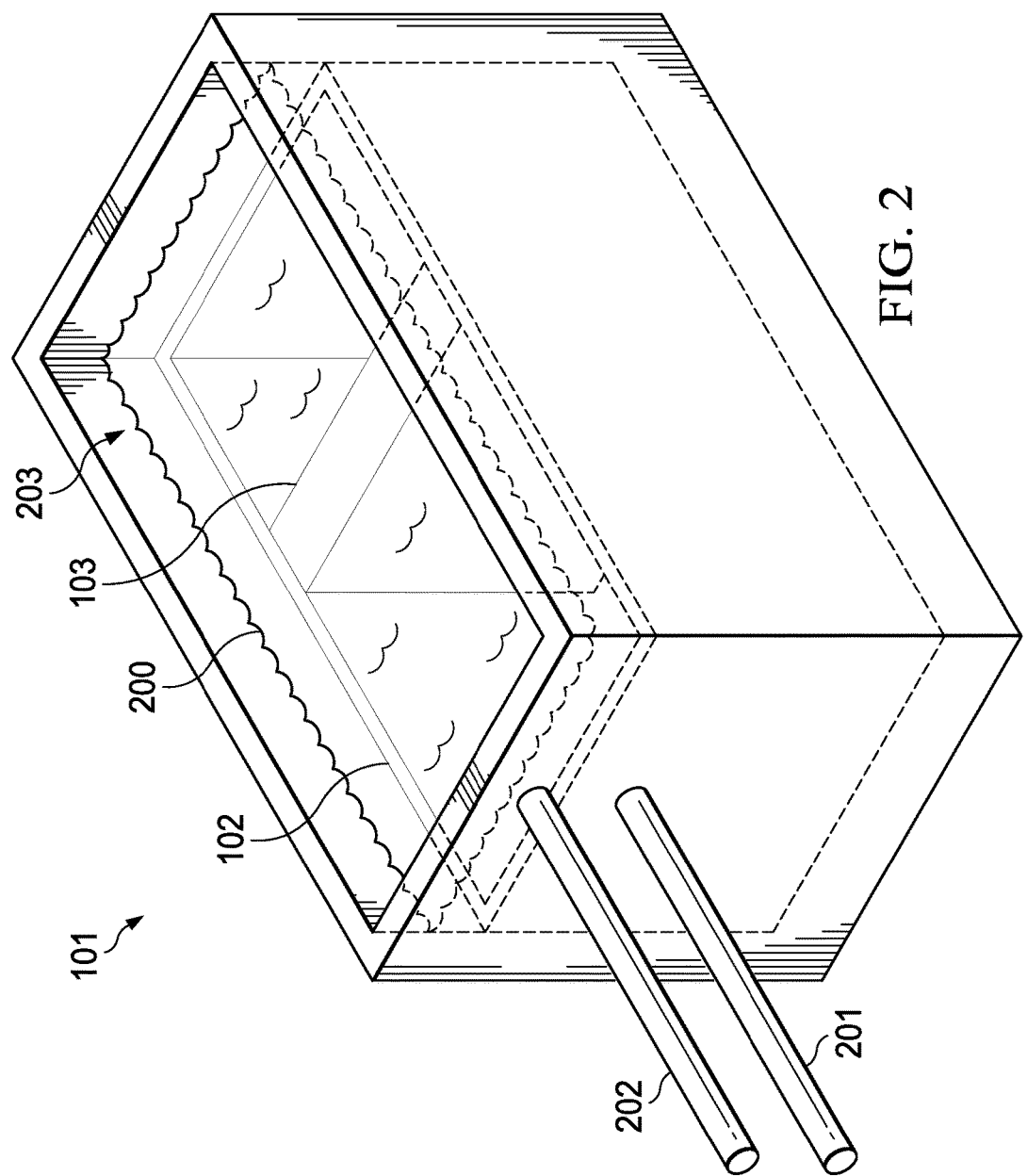
FIG. 2 is a diagram of an example of an immersion-cooled tank according to some embodiments.

FIG. 2 is a diagram of an example of immersion-cooled tank 101 according to some embodiments. Particularly, tank 101 is filled with dielectric liquid coolant 200 and it includes rack 102 for mounting submerged IHSs 103A-N. Tank 101 may be fabricated of steel, a plastic that is compatible with dielectric liquid coolant 200, or any other suitable material. As shown, tank 101 may face upward with an open top to form an open interior volume sufficient to insert one or more IHSs 103A-N.

Tank 101 has an inlet pipe or line 202 from a piping system connected to heat exchanger 105 for the flow of lower temperature or cooled liquid coolant into tank 101 and an outlet pipe or line 201 connected to collection piping for the flowing or pumping of heated coolant out of tank 101 via pump-filter assembly 104.

Generally speaking, dielectric liquid coolant 200 fills tank 101 up to a predetermined height, resulting in coolant-to-air surface 203. In various implementations, rack 102 may be designed such that the chassis of IHSs 103A-N are entirely submerged—that is, the topmost portion of IHSs 103A-N rests under surface 203 of dielectric liquid coolant 200. In various embodiments, the chassis may be unsealed against dielectric liquid coolant 200. Moreover, the front of the chassis of each IHS 103A-N may face the bottom of tank 101, so that the rear portion of the chassis, which contains connectors for various components and/or peripherals, are accessible from the top without necessarily having to remove the IHS from tank 101 in order to make those connections. One of these components may be a power supply, described in more detail with respect to FIGS. 4-6.

Figure 3:
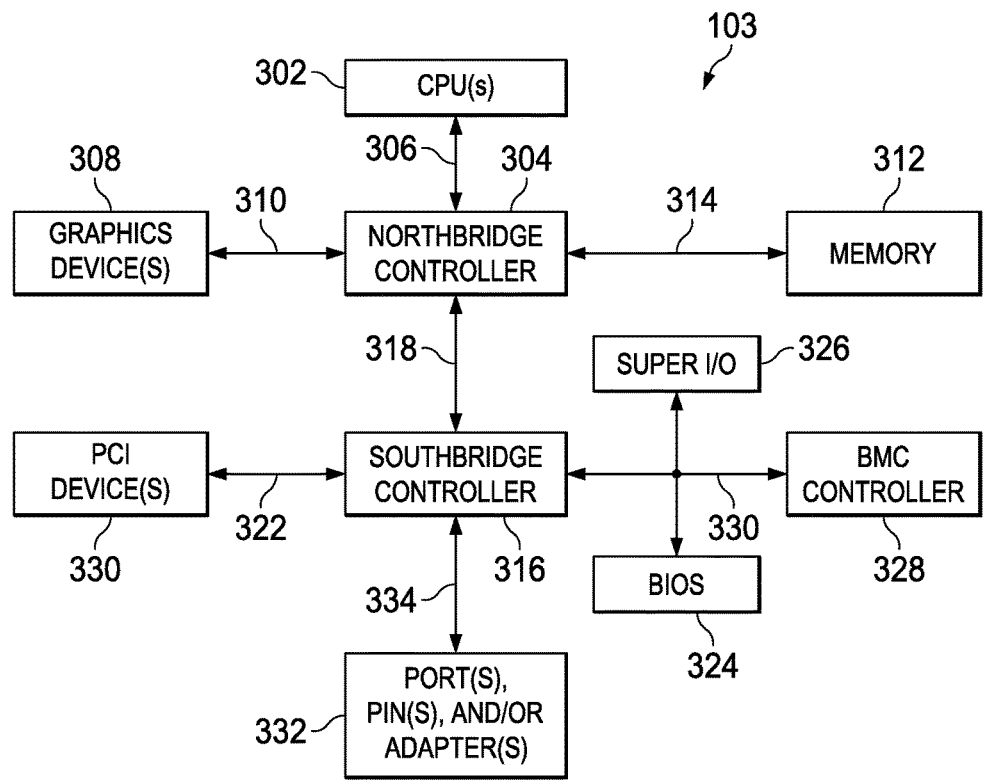
FIG. 3 is a diagram of an example of an Information Handling System (IHS) according to some embodiments.

FIG. 3 is a block diagram an example of IHS 103 which may be cooled within tank 101 of system 100. As shown, IHS 103 includes one or more CPUs 302. In various embodiments, IHS 103 may be a single-processor system including one CPU 302, or a multi-processor system including two or more CPUs 302 (e.g., two, four, eight, or any other suitable number). CPU(s) 302 may include any processor capable of executing program instructions. For example, in various embodiments, CPU(s) 302 may be general-purpose or embedded processors implementing any of a variety of instruction set architectures (ISAs), such as the x86, POWERPC, ARM, SPARC, or MIPS ISAs, or any other suitable ISA. In multi-processor systems, each of CPU(s) 302 may commonly, but not necessarily, implement the same ISA. In an embodiment, a motherboard (not shown) may be configured to provide structural support, power, and electrical connectivity between the various components illustrated in FIG. 3.

CPU(s) 302 are coupled to northbridge controller or chipset 304 via front-side bus 306. Northbridge controller 304 may be configured to coordinate I/O traffic between CPU(s) 302 and other components. For example, in this particular implementation, northbridge controller 304 is coupled to graphics device(s) 308 (e.g., one or more video cards or adaptors, etc.) via graphics bus 310 (e.g., an Accelerated Graphics Port or AGP bus, a Peripheral Component Interconnect or PCI bus, etc.). Northbridge controller 304 is also coupled to system memory 312 via memory bus 314. Memory 312 may be configured to store program instructions and/or data accessible by CPU(s) 302. In various embodiments, memory 312 may be implemented using any suitable memory technology, such as static RAM (SRAM), synchronous dynamic RAM (SDRAM), nonvolatile/Flash-type memory, or any other type of memory.

Northbridge controller 304 is coupled to southbridge controller or chipset 316 via internal bus 318. Generally, southbridge controller 316 may be configured to handle various of IHS 103's I/O operations, and it may provide interfaces such as, for instance, Universal Serial Bus (USB), audio, serial, parallel, Ethernet, etc., via port(s), pin(s), and/or adapter(s) 332 over bus 324. For example, southbridge controller 316 may be configured to allow data to be exchanged between IHS 103 and other devices, such as other IHSs attached to a network. In various embodiments, southbridge controller 316 may support communication via wired or wireless general data networks, such as any suitable type of Ethernet network, for example; via telecommunications/telephony networks such as analog voice networks or digital fiber communications networks; via storage area networks such as Fiber Channel SANs; or via any other suitable type of network and/or protocol.

Southbridge controller 316 may also enable connection to one or more keyboards, keypads, touch screens, scanning devices, voice or optical recognition devices, or any other devices suitable for entering or retrieving data. Multiple I/O devices may be present in IHS 103. In some embodiments, I/O devices may be separate from IHS 103 and may interact with IHS 103 through a wired or wireless connection. As shown, southbridge controller 316 is further coupled to one or more PCI devices 320 (e.g., modems, network cards, sound cards, video cards, etc.) via PCI bus 322, including, for example, self-encrypting Hard Disk Drives (HDDs) or Solid State Drives (SSDs). Southbridge controller 316 is also coupled to Basic I/O System (BIOS) 324, Super I/O Controller 326, and Baseboard Management Controller (BMC) 328 via Low Pin Count (LPC) bus 320.

BIOS 324 includes non-volatile memory having program instructions stored thereon. Those instructions may be usable CPU(s) 302 to initialize and test other hardware components and/or to load an Operating System (OS) onto IHS 103. As such, BIOS 324 may include an interface that allows CPU(s) 302 to load and execute certain firmware. In some cases, such firmware may include program code that is compatible with the Unified Extensible Firmware Interface (UEFI) specification, although other types of firmware may be used.

BMC controller 328 may include non-volatile memory having program instructions stored thereon that are usable by CPU(s) 302 to enable remote management of IHS 103. For example, BMC controller 328 may enable a user to discover, configure, and manage BMC controller 328, setup configuration options, resolve and administer hardware or software problems, etc. Additionally or alternatively, BMC controller 328 may include one or more firmware volumes, each volume having one or more firmware files used by the BIOS' firmware interface to initialize and test components of IHS 103.

Super I/O Controller 326 combines interfaces for a variety of lower bandwidth or low data rate devices. Those devices may include, for example, floppy disks, parallel ports, keyboard and mouse, temperature sensor and fan speed monitoring, etc.

In some cases, IHS 103 may be configured to access different types of computer-accessible media separate from memory 312. Generally speaking, a computer-accessible medium may include any tangible, non-transitory storage media or memory media such as electronic, magnetic, or optical media—e.g., magnetic disk, a hard drive, a CD/DVD-ROM, a Flash memory, etc. coupled to IHS 103 via northbridge controller 304 and/or southbridge controller 316.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

A person of ordinary skill in the art will appreciate that IHS 103 is merely illustrative and is not intended to limit the scope of the disclosure described herein. In particular, any computer system and/or device may include any combination of hardware or software capable of performing certain operations described herein. In addition, the operations performed by the illustrated components may, in some embodiments, be performed by fewer components or distributed across additional components. Similarly, in other embodiments, the operations of some of the illustrated components may not be performed and/or other additional operations may be available.

For example, in some implementations, northbridge controller 304 may be combined with southbridge controller 316, and/or be at least partially incorporated into CPU(s) 302. In other implementations, one or more of the devices or components shown in FIG. 3 may be absent, or one or more other components may be added. Accordingly, systems and methods described herein may be implemented or executed with other computer system configurations.

A person of ordinary skill will recognize that IHS 103 of FIG. 3 is only one example of a system in which the certain embodiments may be utilized. Indeed, the embodiments described herein may be used in various electronic devices, such as network router devices, televisions, custom telecommunications equipment for special purpose use, etc. That is, certain techniques described herein are in no way limited to use with the IHS of FIG. 3.

In order for an off-the-shelf power supply to be coupled to IHS 103 and submerged within liquid coolant 200, the electrical fan that is part of the power supply may need to be removed. In many cases, however, removing the fan causes the power supply to shut down. Although this behavior can theoretically be changed by power supply manufacturers, such a feature would require modifications that would make the power supply no longer "off-the-shelf."

Moreover, power supplies have been designed for, built and tested, and certified by multiple safety and regulatory agencies all based on an air cooled design. But, once the fan is removed, the power supply is no longer compliant with any of those certifications. The mere fact of using any liquid as the coolant voids certain tests. The costs involved in retesting and recertifying custom-build power supplies for immersion cooling is prohibitive, especially when multiple types of liquid coolants are being considered.

To address these and other issues, an extended power supply assembly may be provided, for example, in the form of a long enclosure, open on opposite ends, whose small end has the same outer dimensions as the off-the-shelf power supply and mimics the power supply's mechanical retention feature(s). The opposite larger end of the assembly may have inner dimensions matching an IHS chassis' power bay, and it may contain the same power supply retention feature. The assembly may include a printed circuit board (PCB) or wiring harness that can plug into the power connector inside the chassis and extend those power conductors outside and above the liquid coolant's surface 203.

In some cases, the whole assembly may be shipped uninstalled from the chassis, so an end-user may install the assembly with power supply after he or she has immersed the IHS in the liquid coolant. In some cases, tank 101 may be modified with stops to hold its lid (when one is provided) above the overall height needed for this extension when the tank lid is closed (e.g., by approximately 2 inches) to prevent interference between IHS 103 and such lid. Also, as shown in more detail below, the power supply assembly may have a handle protruding from the larger end. In addition to acting as a handle, this feature may provide protection from the power cord should the tank's lid come down (e.g., accidentally) on IHS 103.

Figure 4:
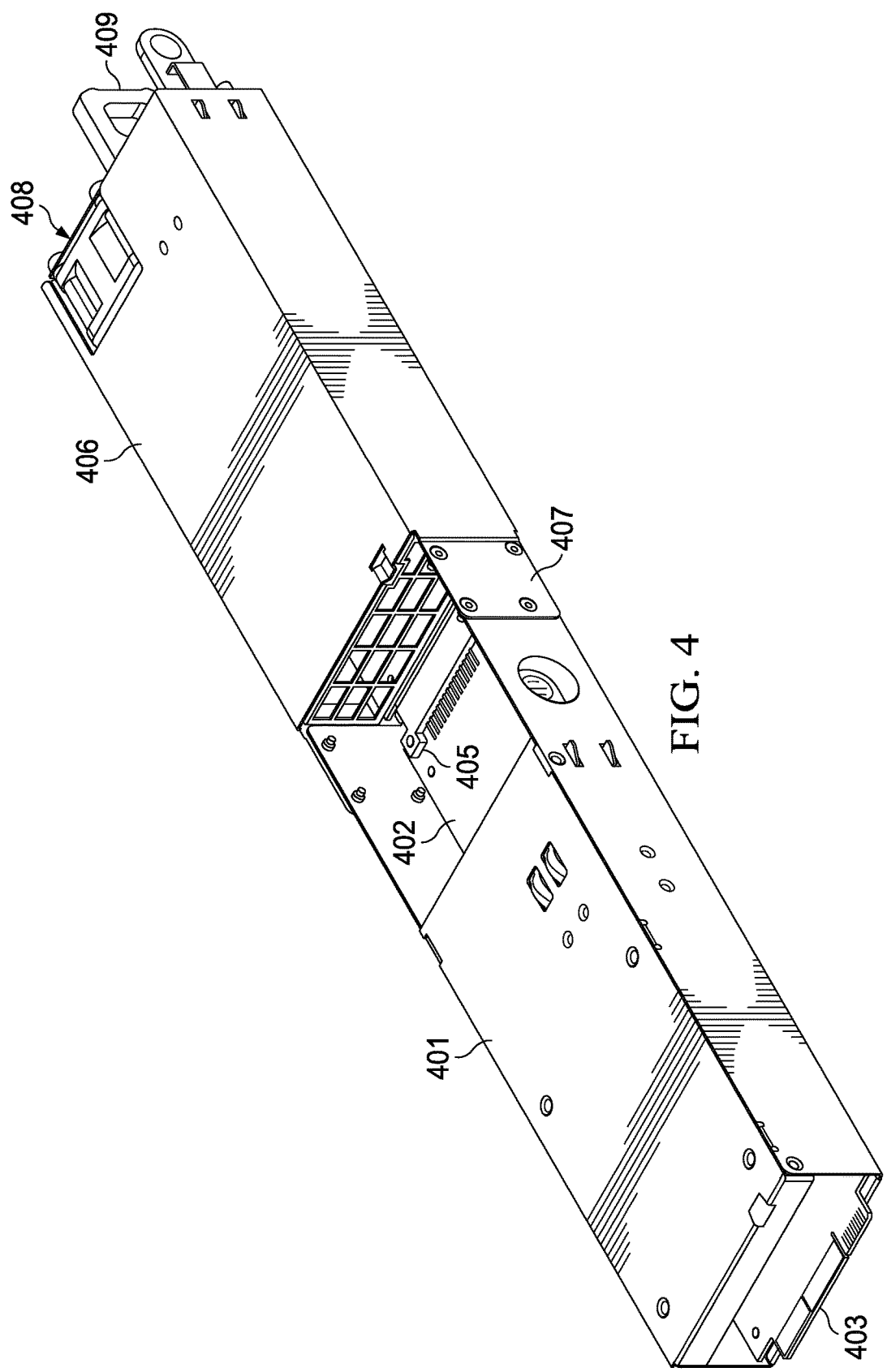
FIGS. 4-6 are diagrams of an example of a dry power supply assembly according to some embodiments.
Figure 5:
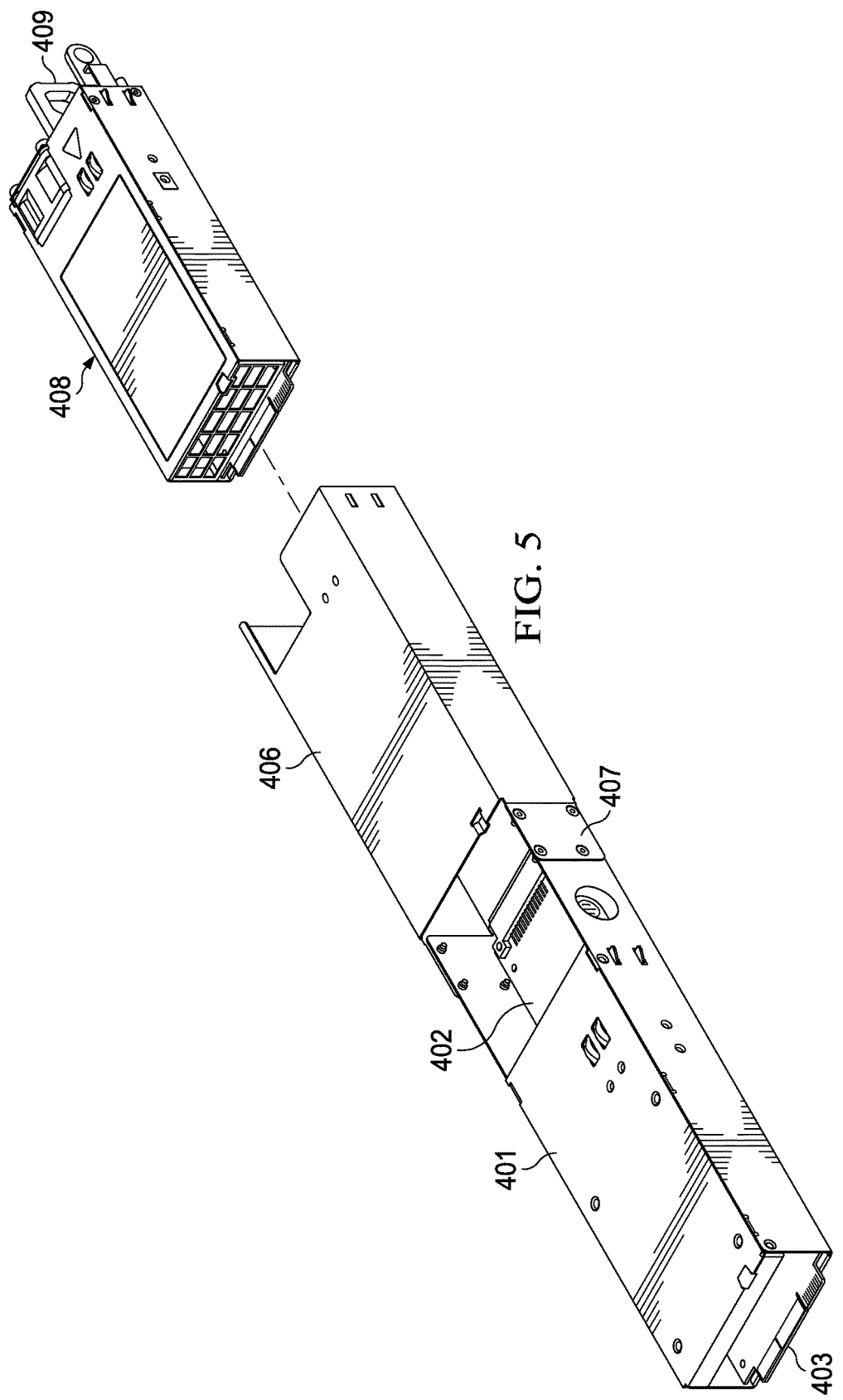
Figure 6:
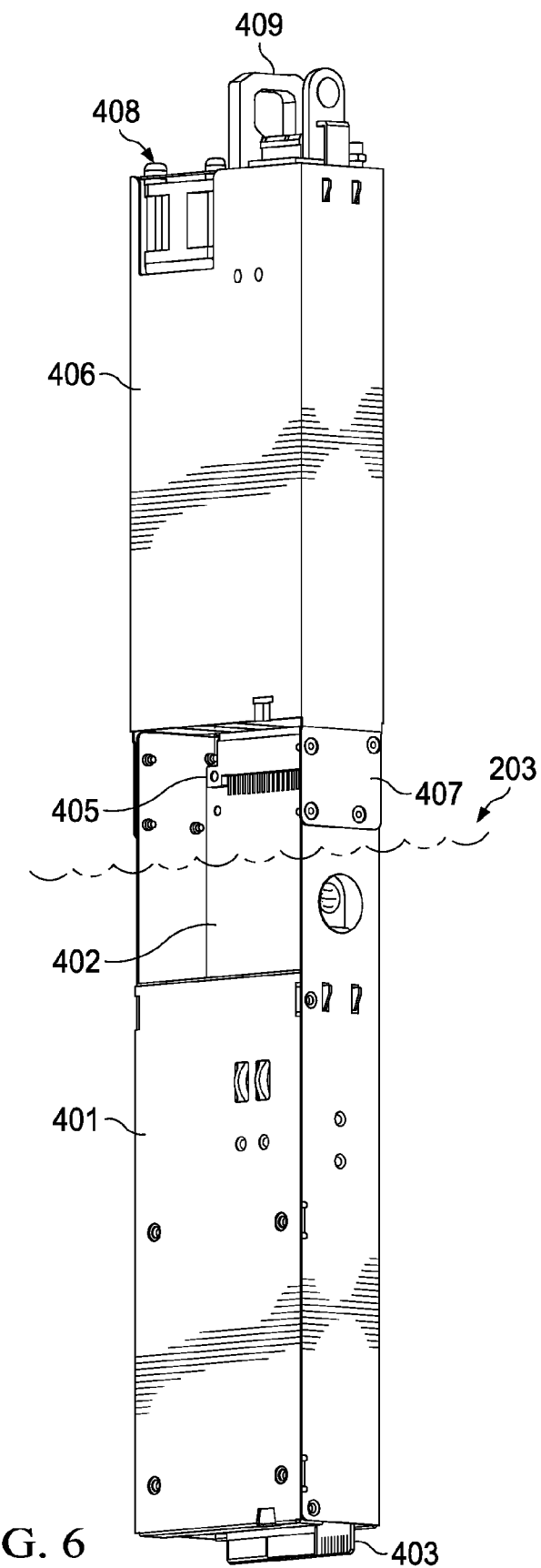

FIGS. 4-6 are diagrams of an example of a dry power supply assembly according to some embodiments. As shown, the assembly includes extension casing or portion 401 and bay casing or portion 406. Particularly, extension portion 401 includes PCB 402, first electrical connector 403 (e.g., male), and second electrical connector 405 (e.g., female). PCB 402 includes electrical conductors, traces, or lines printed thereon that couple each terminal of first electrical connector 403 to a corresponding terminal of second electrical connector 405 such that, when first electric connector 403 is coupled to a given connector of IHS 103 (e.g., on the IHS's motherboard), second electric connector 405 becomes an extension of that IHS connector. Although described at PCB 402, in some cases a harness or other writing may be used between first electrical connector 403 and second electrical connector 405.

Bay portion 406 is coupled to extension portion 401 using retention tabs 407 and/or mechanical fasteners. From the perspective of bay portion 406, the coupling between bay portion 406 and extension portion 401 is the same as it would be should bay portion 406 be coupled directly to IHS 103; that is, bay portion 406 may also be an off-the-shelf component without any modifications. In some cases, however, handle portion 409 may be added to protect certain writing or components from accidents, as described above.

Power supply unit (PSU) 408 is an off-the-shelf power supply. From the perspective of PSU 408 it slides in and out of bay portion 406 as shown in FIG. 5, therefore connecting and disconnecting from second electrical connector 405 as if bay portion 406 were coupled directly to IHS 103—that is, PSU is agnostic as to the presence of PCB extension portion 401. Moreover, bay portion 406 is also agnostic as to PCB extension portion 401, insofar as it sees second electrical connector 405 as if it were a connector on an IHS motherboard.

As shown in FIG. 6, in some implementations, the length of PCB extension portion 401 may be designed to keep PSU 408 above surface 203 of dielectric liquid coolant 200 when PCB extension portion 401 inserted into a corresponding slot of IHS 103, and when IHS 103 mounted facing down on rack 102 within tank 101.

In sum, using the systems and methods described herein, a power supply assembly may be configured to physically support a power supply above the surface of a dielectric liquid coolant during operation of an IHS that is being cooled by that liquid. The off-the-shelf power supply may comprise a fan that operates with air above the surface of the dielectric liquid coolant, and without the need to for re-design or re-certification.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS), comprising:
    a chassis configured to be at least partially disposed under a surface of a dielectric liquid coolant within a tank, wherein the chassis includes one or more components configured to be cooled by the dielectric liquid coolant during operation of the IHS;
    a power supply coupled to a rear end of the chassis, wherein the power supply is configured to provide power to the one or more components, wherein the rear end of the chassis is oriented upwards when the IHS is placed in the tank, and wherein the power supply comprises a fan configured to blow air; and
    an electrical adaptor configured to couple the power supply to the chassis while physically supporting the fan of the power supply above the surface of the dielectric liquid coolant during operation of the power supply, wherein the electrical adaptor includes a first electrical connector configured to be coupled to the one or more components of the IHS and a second electrical connector configured to be coupled to the power supply, wherein the first and second electrical connectors are coupled to each other via a printed circuit board (PCB), and wherein the second electrical connector is disposed on an opposite end of the PCB from the first electrical connector.

2. The IHS of claim 1, wherein the IHS is a server.

3. The IHS of claim 1, wherein the chassis is unsealed against the dielectric liquid coolant.

4. The IHS of claim 1, wherein the dielectric liquid coolant comprises oil.

5. The IHS of claim 1, wherein the tank comprises a rack and an open top configured to be covered by a lid, and the chassis is mountable on the rack such that the IHS is removable from the tank through the open top while another IHS remains in operation, the another IHS at least partially disposed under the surface of the dielectric liquid coolant.

6. The IHS of claim 1, wherein the one or more components comprises a processor.

7. The IHS of claim 1, wherein the power supply is an off-the-shelf power supply.

8. The IHS of claim 1, wherein the electrical adaptor includes a bay coupled to the PCB and configured to receive the power supply, the bay configured to allow a power supply connector of the power supply to be coupled to the second electrical connector.

9. The IHS of claim 8, wherein the bay is configured to hold the power supply above the surface of the dielectric liquid coolant while a portion of the PCB remains under the surface of the dielectric liquid coolant.

10. The IHS of claim 9, wherein the power supply includes a handle portion configured to allow a user to slide the power supply in and out of the bay coupling and decoupling the power supply to and from the chassis, respectively.

* * * * *